United States Patent
Fujii et al.

(10) Patent No.: US 7,482,281 B2
(45) Date of Patent: Jan. 27, 2009

(54) SUBSTRATE PROCESSING METHOD

(75) Inventors: Yasushi Fujii, Nirasaki (JP); Takayuki Toshima, Koshi (JP); Takehiko Orii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 330 days.

(21) Appl. No.: 11/517,272

(22) Filed: Sep. 8, 2006

(65) Prior Publication Data
US 2007/0077768 A1 Apr. 5, 2007

(30) Foreign Application Priority Data
Sep. 29, 2005 (JP) ............................. 2005-285432

(51) Int. Cl.
*H01L 21/302* (2006.01)
*H01L 21/461* (2006.01)

(52) U.S. Cl. .................. 438/745; 438/734; 438/689; 257/E21.305; 257/E21.259

(58) Field of Classification Search ................. 438/689, 438/725, 734, 745, 755; 257/E21.305, E21.259
See application file for complete search history.

(56) References Cited

U.S. PATENT DOCUMENTS

| 5,350,485 A | * | 9/1994 | Shiraishi et al. ............... 216/13 |
| 6,270,948 B1 | * | 8/2001 | Sato et al. .................... 430/314 |
| 6,518,191 B2 | * | 2/2003 | Nakagawa .................. 438/710 |
| 6,979,655 B2 | | 12/2005 | Niuya et al. |
| 7,061,010 B2 | * | 6/2006 | Minakata ..................... 257/40 |
| 2004/0002214 A1 | * | 1/2004 | Mizutani et al. ............ 438/689 |
| 2004/0106064 A1 | * | 6/2004 | Choi ....................... 430/270.1 |
| 2005/0074963 A1 | * | 4/2005 | Fujii et al. .................. 438/623 |
| 2005/0095840 A1 | | 5/2005 | Bhanap et al. |

FOREIGN PATENT DOCUMENTS

JP 2004-214388 7/2004

OTHER PUBLICATIONS

Singapore Search Report, dated Apr. 11, 2007, in connection with Application No. 200606240-0.

* cited by examiner

*Primary Examiner*—Alexander G Ghyka
*Assistant Examiner*—Seahvosh J Nikmanesh
(74) *Attorney, Agent, or Firm*—Smith, Gambrell & Russell, LLP

(57) ABSTRACT

A substrate processing method includes: performing an etching process to form a predetermined pattern on an etching-target film disposed on a substrate; denaturing a substance remaining after the etching process to be soluble in a predetermined liquid; then, performing a silylation process on a surface of the etching-target film having the pattern formed thereon; and then, supplying the predetermined liquid to dissolve and remove the denatured substance.

22 Claims, 11 Drawing Sheets

SUBSTRATE PROCESSING METHOD

BACKGROUND OF THE INVENTION

1. Field of the Invention

The present invention relates to a substrate processing method for performing a denaturing process for denaturing a predetermined substance and a process for dissolving and removing the denatured substance, in manufacturing a semiconductor device by use of, e.g., a dual damascene method. The present invention also relates to a computer readable memory medium that stores a control program for executing a method of this kind.

2. Description of the Related Art

In semiconductor devices, a decrease in the interconnection line space due to miniaturization increases the capacitance between interconnection lines, which makes the signal propagation rate lower, thereby resulting in a delay in operation speed. In order to solve this problem, developments are being made in insulative materials with a low specific dielectric constant (Low-k materials), and multi-layer interconnection lines using such insulative materials. On the other hand, copper is attracting attentions as an interconnection line material, because it has a low resistivity and a high electromigration resistance. Where copper is used for forming interconnection lines in trenches and/or connection holes, a single damascene method and/or a dual damascene method are frequently used.

FIGS. 1A to 1F are explanatory views showing steps of a process for forming a multi-layer cupper interconnection line, using a dual damascene method. An insulating film (Low-k film) 200 made of a Low-k material is disposed on a silicon substrate (not shown) At first, a lower interconnection line 202 made of copper is formed in the insulating film 200 with a barrier metal layer 201 interposed therebetween. Then, a Low-k film 204 used as an inter-level insulating film is formed thereon with an etching stopper film 203 interposed therebetween. Then, an anti-reflective coating (BARC: Bottom Anti-Reflective Coating) 205 and a resist film 206 are formed in this order on the surface of the Low-k film 204. Then, the resist film 206 is subjected to light exposure with a predetermined pattern and is then development, so that a circuit pattern is formed on the resist film 206 (FIG. 1A).

Then, using the resist film 206 as a mask, the Low-k film 204 is etched to form a via-hole 204a (FIG. 1B). Then, the anti-reflective coating 205 and resist film 206 are removed by, e.g., a chemical liquid process and an ashing process. Then, a sacrificial film 207 is formed on the surface of the insulating film 204 including the via-hole 204a (FIG. 1C). At this time, the via-hole 204a is filled with the sacrificial film 207.

Then, a resist film 208 is formed on the surface of the sacrificial film 207. Then, the resist film 208 is subjected to light exposure with a predetermined pattern and is then development, so that a circuit pattern is formed on the resist film 208 (FIG. 1D). Then, using the resist film 208 as a mask, the sacrificial film 207 and Low-k film 204 are etched to form a wider trench 204b on the via-hole 204a (FIG. 1E). Then, the resist film 208 and sacrificial film 207 are removed to complete the via-hole 204a and trench 204b in the insulating film 204 (FIG. 1F). Then, the via-hole 204a and trench 204b are filled with copper as an upper interconnection line.

Incidentally, the sacrificial film 207 is sometimes made of an Si—O based inorganic material, which is difficult to remove by an ashing process used for removing the conventional resist film. There is a case where a chemical liquid is used to dissolve a film of this kind, but the processing rate is very low.

As a method for removing a sacrificial film of this kind, there is proposed a technique in which a process gas containing water vapor and ozone is used to denature the sacrificial film to be soluble in a predetermined chemical liquid, and then the sacrificial film is removed by the chemical liquid (Jpn. Pat. Appln. KOKAI Publication No. 2004-214388).

However, when a process is performed by a process gas containing water vapor and ozone, a Low-k material used as an inter-level insulating film having a pattern may be damaged. The damage in the pattern may become obvious by a subsequent chemical liquid process.

Further, as described above, a process gas containing water vapor and ozone is used to perform a solubilization process, and then a chemical liquid is used to perform a cleaning process. In this case, a Low-k material may be damaged and thereby increase the specific dielectric constant thereof, which deteriorates effects obtained by using the Low-k material as an inter-level insulating film.

BRIEF SUMMARY OF THE INVENTION

An object of the present invention is to provide a substrate processing method such that, where a process for removing a residual substance of, e.g., a sacrificial film is performed subsequently to etching of an etching-target film, by solubilizing the residual substance relative to a predetermined liquid, and then removing the residual substance by the predetermined liquid, the method brings about little damage, such as pattern peeling.

Another object of the present invention is to provide a substrate processing method, which can, in addition to that described above, suppress deterioration in an electric property of an etching-target film due to damage caused by a process for removing a residual substance.

Still another object of the present invention is to provide a computer readable memory medium that stores a control program for executing a substrate processing method as one of those described above.

According to a first aspect of the present invention, there is provided a substrate processing method comprising: performing an etching process to form a predetermined pattern on an etching-target film disposed on a substrate; denaturing a substance remaining after the etching process to be soluble in a predetermined liquid; then, performing a silylation process on a surface of the etching-target film having the pattern formed thereon; and then, supplying the predetermined liquid to dissolve and remove the denatured substance.

According to a second aspect of the present invention, there is provided a substrate processing method comprising: forming a sacrificial film on an etching-target film disposed on a substrate; forming an etching mask on the sacrificial film, and etching the sacrificial film and the etching-target film to form a predetermined pattern; denaturing the sacrificial film and the etching mask to be soluble in a predetermined liquid; then, performing a silylation process on a surface of the etching-target film having the pattern formed thereon; and then, supplying the predetermined liquid to dissolve and remove the denatured substance.

In the first and second aspects, the method preferably further comprises performing a silylation process on a surface of the etching-target film after removing the denatured substance.

The present invention is effective in a case where the etching-target film comprises a low dielectric constant material. Particularly, the present invention is effective in a case where the low dielectric constant material includes alkyl groups as end groups.

Said denaturing is preferably performed while supplying a process gas containing water vapor and ozone. Said denaturing may be performed while supplying a process gas containing ozone and not containing water vapor. The present invention is effective in a case where the predetermined liquid is an acid or alkaline chemical liquid.

The silylation process is preferably performed while using a compound including silazane bonds (Si—N) in molecules. Preferably, the compound including silazane bonds in molecules is TMDS (1,1,3,3-Tetramethyldisilazane) or TMS-DMA (Dimethylaminotrimethylsilane).

According to a third aspect of the present invention, there is provided a control program for execution on a computer, wherein the control program, when executed, causes the computer to control a manufacturing apparatus to conduct one of the substrate processing methods described above.

According to a fourth aspect of the present invention, there is provided a computer readable storage medium that stores a control program for execution on a computer, wherein the control program, when executed, causes the computer to control a manufacturing apparatus to conduct one of the substrate processing methods described above.

According to the present invention, etching is performed on an etching target film that can be easily damaged, such as a Low-k film, while using a substance difficult to remove, such as a sacrificial film. Then, a process for removing a residual substance of, e.g., the sacrificial film is performed, by solubilizing the residual substance relative to a predetermined liquid, and then dissolving and removing the residual substance by the predetermined liquid. At this time, a silylation process is performed to recover damage of the etching target film before dissolving and removing the residual substance. Consequently, it is possible to prevent pattern damage, such as pattern CD loss, from being caused by dissolving and removing the residual substance.

Further, where additional silylation process is performed after dissolving and removing the residual substance, it is possible to recover a deterioration in the electric property of the etching-target film due to damage caused by dissolving and removing the residual substance.

DETAILED DESCRIPTION OF THE INVENTION

An embodiment of the present invention will now be described with reference to the accompanying drawings. Hereinafter, the present invention is exemplified by a case where a semiconductor device is manufactured by a dual damascene method.

Figure 1A:
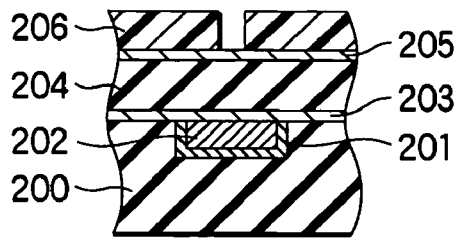
FIGS. 1A to 1F are sectional views schematically showing steps of a process for forming an interconnection line in a trench, using a conventional dual damascene method.
Figure 1D:
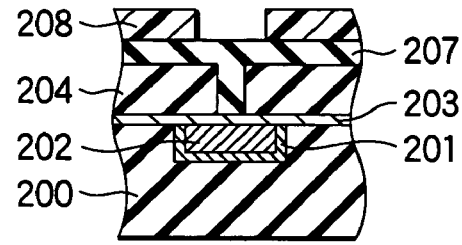
Figure 1B:
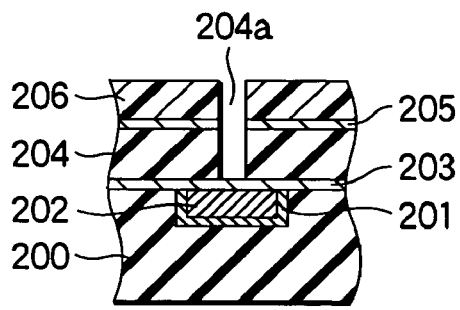
Figure 1E:
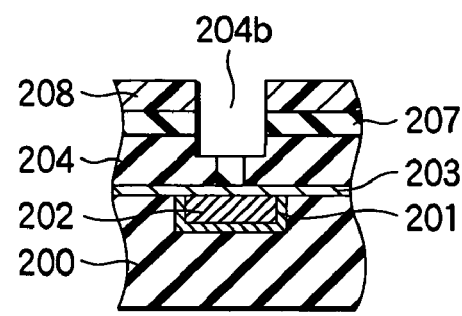
Figure 1C:
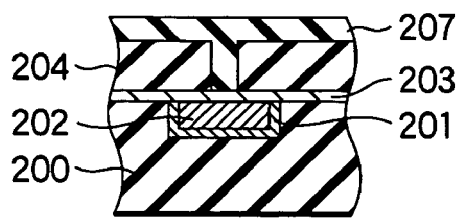
Figure 1F:
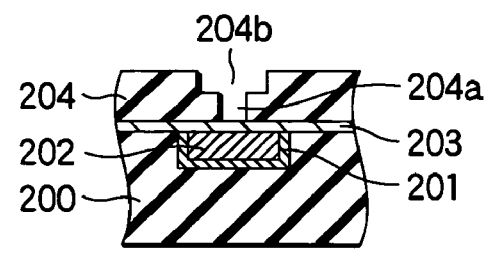
Figure 2:
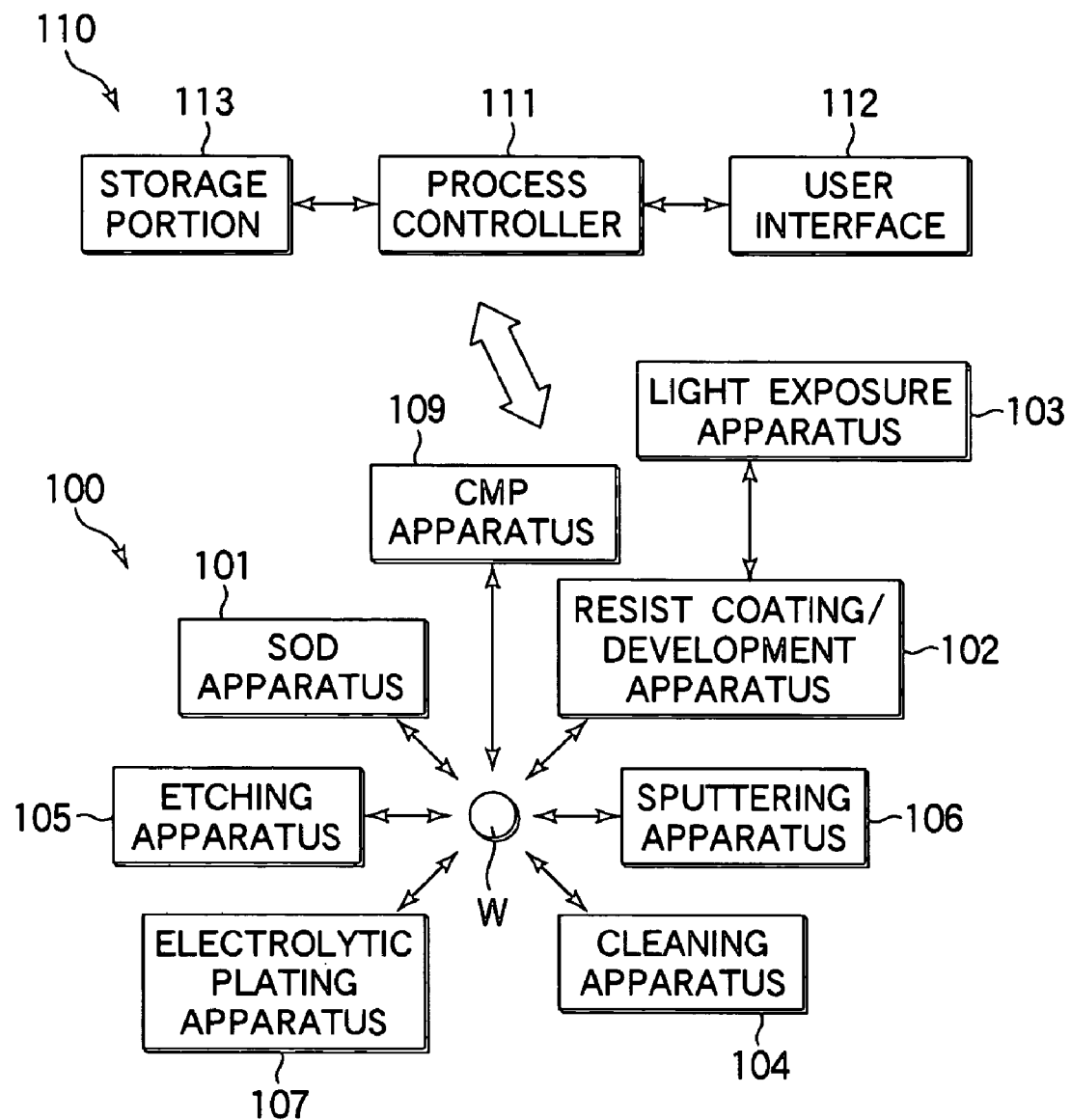
FIG. 2 is an explanatory view schematically showing the arrangement of a wafer processing system used for a semiconductor device manufacturing process employing a dual damascene method, to which a substrate processing method according to an embodiment of the present invention is applied.

FIG. 2 is an explanatory view schematically showing the arrangement of a wafer processing system used for a semiconductor device manufacturing process employing a dual damascene method, to which a substrate processing method according to an embodiment of the present invention is applied. This wafer processing system includes a process section 100 and a main control section 110. The process section 100 includes an SOD (Spin On Dielectric) apparatus 101, a resist coating/development apparatus 102, a light exposure apparatus 103, a cleaning apparatus 104, an etching apparatus 105, a sputtering apparatus 106 used as a PVD apparatus, an electrolytic plating apparatus 107, and a CMP apparatus 109 used as a polishing apparatus. The main control section 110 includes a process controller 111, a user interface 112, and a memory portion 113. The SOD apparatus 101, sputtering apparatus 106, and electrolytic plating apparatus 107 of the process section 100 is film formation apparatuses. As a method for transferring a wafer W between apparatuses in the process section 100, a transfer method by an operator and/or a transfer method by a transfer unit (not shown) are used.

Each of the apparatuses in the process section 100 is connected to and controlled by the process controller 111 having a CPU. The process controller 111 is connected to the user interface 112, which includes, e.g., a keyboard and a display, wherein the keyboard is used for a process operator to input commands for operating the apparatuses in the process section 100, and the display is used for showing visualized images of the operational status of the apparatuses in the process section 100. Further, the process controller 111 is connected to the memory portion 113, which stores recipes with control programs and process condition data recorded therein, for realizing various processes performed in the process section 100 under the control of the process controller 111.

A required recipe is retrieved from the memory portion 113 and executed by the process controller 111 in accordance with an instruction or the like through the user interface 112. Consequently, each of various predetermined processes is performed in the process section 100 under the control of the process controller 111. Recipes may be stored in a readable memory medium, such as a CD-ROM, hard disk, flexible disk, or nonvolatile memory. Further, recipes may be utilized on-line, while it is transmitted among the respective apparatuses in the process section 100, or transmitted from an external apparatus through, e.g., a dedicated line, as needed.

In place of the global control by the main control section 110, or along with the global control by the main control section 110, each of the apparatuses in the process section 100 may be provided with and controlled by its own control section including a process controller, a user interface, and a storage portion.

The SOD apparatus 101 is used to apply a chemical liquid onto a wafer W to form an inter-level insulating film formed of, e.g., a Low-k film, or an etching stopper film by a spin coating method. Although the structure of the SOD apparatus 101 is not shown in detail, the SOD apparatus 101 includes a spin coater unit and a heat processing unit to perform a heat process on a wafer W with a coating film formed thereon. In the case of a wafer processing system, a CVD apparatus may be used to form an insulating film on a wafer W by a chemical vapor deposition (CVD) method, in place of the SOD apparatus 101.

The resist coating/development apparatus 102 is used to form a resist film used as an etching mask, and an anti-reflective coating. Although the resist coating/development apparatus 102 is not shown in detail, the resist coating/development apparatus 102 includes a resist coating unit, a BARC coating unit, a sacrificial film coating unit, a developing unit, and thermal processing units. The resist coating unit is arranged to apply a resist liquid onto a wafer W to form a resist film by spin coating. The BARC coating unit is arranged to apply an anti-reflective coating (BARC) onto a wafer W. The sacrificial film coating unit is arranged to apply a sacrificial film (SLAM) onto a wafer W. The developing unit is arranged to perform a development process on a resist film which has been subjected to light exposure with a predetermined pattern in the light exposure apparatus 103. The thermal processing units are arranged to respectively perform thermal processes on a wafer W with a resist film formed thereon, a wafer W treated by a light exposure process, and a wafer W treated by a development process.

The light exposure apparatus 103 is used to subject a wafer W with a resist film formed thereon to light exposure with a predetermined circuit pattern. The cleaning apparatus 104 is arranged to perform a cleaning process using purified water or a chemical liquid, a denaturing process of polymer residues or the like remaining after an etching process, and a recovery process of an inter-level insulating film for damage due to etching, as described later in detail.

The etching apparatus 105 is arranged to perform an etching process on an inter-level insulating film or the like formed on a wafer W. The etching process may be of a type using plasma or a type using a chemical liquid. The sputtering apparatus 106 is used to form, e.g., each of an anti-diffusion film and a Cu seed layer. The electrolytic plating apparatus 107 is arranged to embed Cu in a trench having a Cu seed layer formed therein to form an interconnection line in a trench line. The CMP apparatus 109 is arranged to perform a planarization process on a surface of a groove interconnection line filled with Cu, and so forth.

Figure 3:
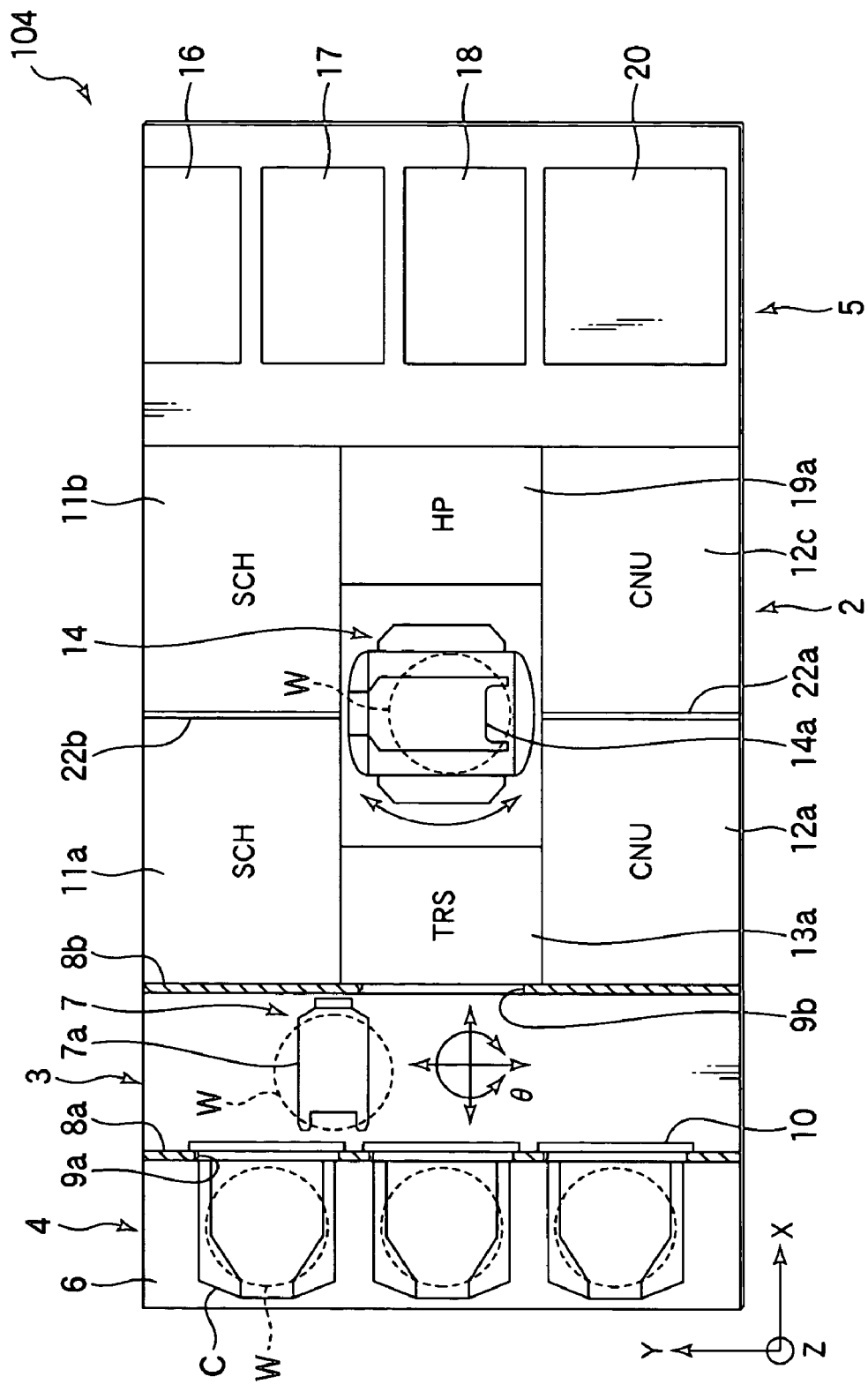
FIG. 3 is a plan view schematically showing the structure of a cleaning apparatus used in the wafer processing system shown in FIG. 2.
Figure 4:
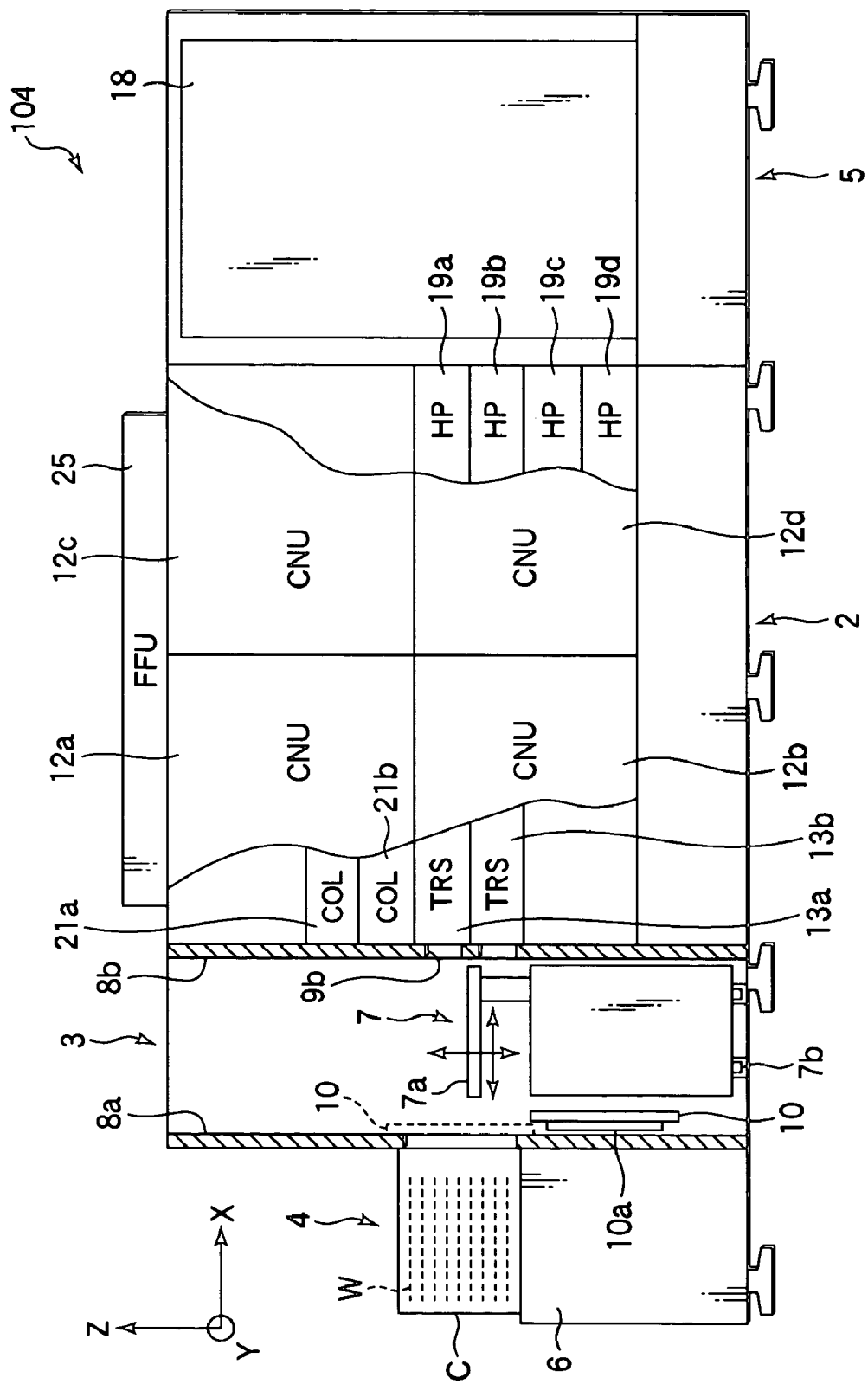
FIG. 4 is a front view schematically showing the structure of the cleaning apparatus shown in FIG. 3.
Figure 5:
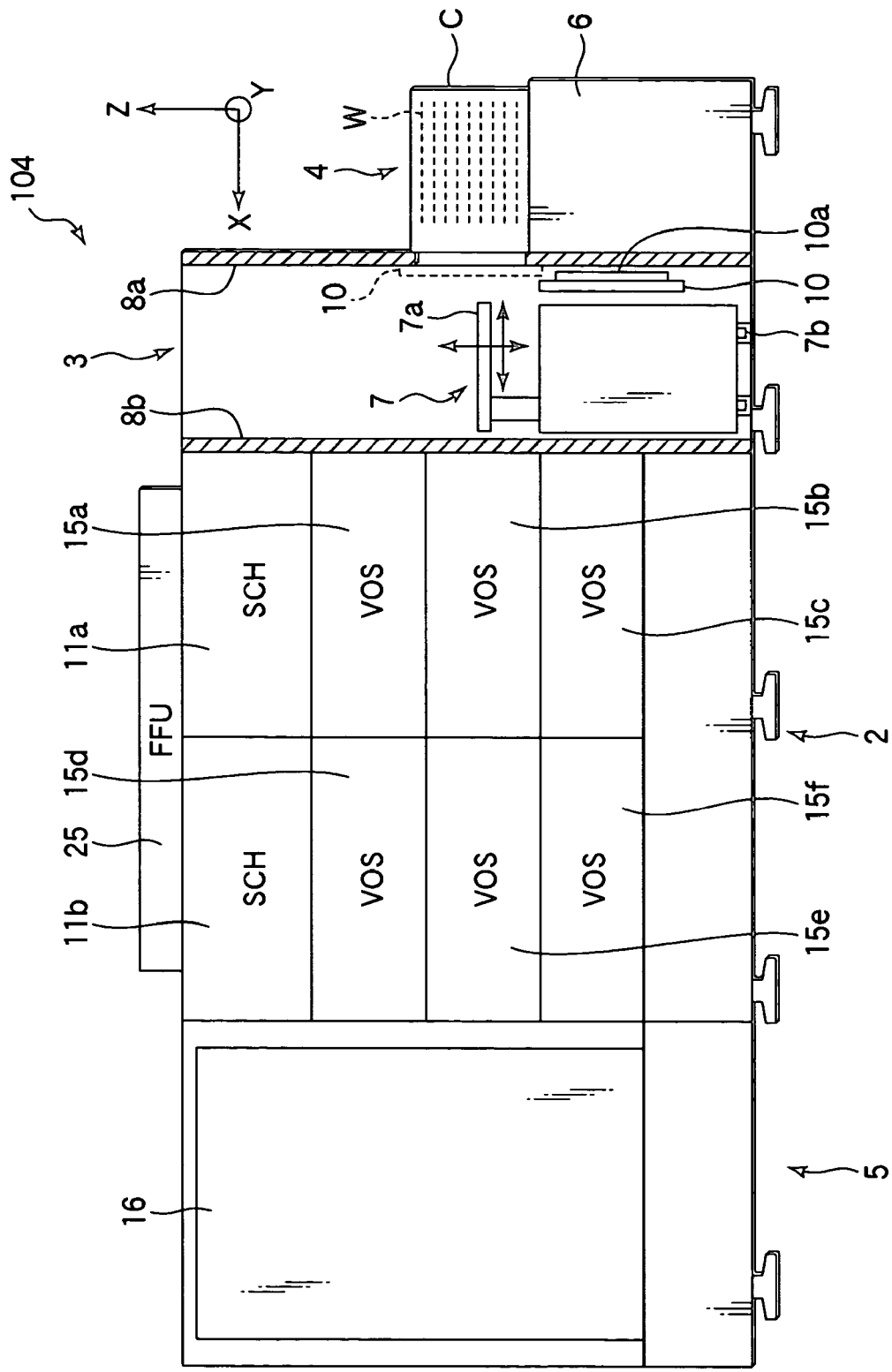
FIG. 5 is a back view schematically showing the structure of the cleaning apparatus shown in FIG. 3.

Next, a detailed explanation will be given of the cleaning apparatus 104, which plays an important part of the present invention. FIGS. 3, 4, and 5 are a plan view, a front view, and a back view, respectively, schematically showing the cleaning apparatus 104. The cleaning apparatus 104 includes a carrier station 4, a process station 2, a transfer station 3, and a chemical station 5. The carrier station 4 is arranged such that carriers each storing wafers W are sequentially transferred from other processing apparatuses onto the carrier station 4. The carrier station 4 is also arranged such that carriers each storing wafers W processed in the cleaning apparatus 104 are transferred from the carrier station 4 to processing apparatuses for subsequent processes. The process station 2 includes a plurality of process units arranged to respectively perform a cleaning process, a denaturing process, and a recovery process. The transfer station 3 is arranged to transfer a wafer W between the process station 2 and carrier station 4. The chemical station 5 is arranged to perform manufacture, preparation, and storage of a chemical liquid, purified water, gas, and so forth to be used in the process station 2.

Each carrier C contains therein wafers W essentially in a horizontal state at regular intervals in the vertical direction (Z-direction). The wafers W are transferred to and from the carrier C through one side of the carrier C, which is opened/closed by a lid 10a (which is not shown in FIG. 3, but shown in FIGS. 4 and 5 in a detached state).

As shown in FIG. 3, the carrier station 4 has a table 6 on which carriers C can be placed at three positions arrayed in a Y-direction defined in FIG. 3. Each carrier C is placed on the table 6 such that the side provided with the lid 10a faces a partition wall 8a between the carrier station 4 and transfer station 3. The partition wall 8a has window portions 9a formed therein at positions corresponding to the mount positions for carriers C. Each of the window portions 9a is provided with a shutter 10 on the transfer station 3 side to open/close the window portion 9a. This shutter 10 includes holding means (not shown) for holding the lid 10a of a carrier C, so that the holding means can hold the lid 10a and withdraw it into the transfer station 3, as shown in FIGS. 4 and 5.

The transfer station 3 is provided with a wafer transfer unit 7 disposed therein, which has a wafer transfer pick 7a for holding a wafer W. The wafer transfer unit 7 is movable in the Y-direction along guides 7b (see FIGS. 4 and 5) extending on the floor of the transfer station 3 in the Y-direction. The wafer transfer pick 7a is slidable in an X-direction, movable up and down in the Z-direction, and rotatable in the X-Y plane (θ rotation).

With the arrangement described above, the wafer transfer pick 7a can access any one of the carriers C placed on the table 6, in a state where the shutters 10 are retreated to allow the interior of the carriers C to communicate with the transfer station 3 through the window portions 9a. Accordingly, the wafer transfer pick 7a can transfer a wafer W from any height position in each of the carriers C, and can transfer a wafer W onto any height position in each of the carriers C.

The process station 2 includes two wafer mount units (TRS) 13a and 13b on the transfer station 3 side. For example, the wafer mount unit (TRS) 13b is used to place a wafer W when the wafer W is transferred from the transfer station 3 to the process station 2. The wafer mount unit (TRS) 13a is used to place a wafer W when the wafer W is returned to the transfer station 3 after it is subjected to a predetermined process in the process station 2.

On the rear side of the process station 2, there are denaturing units (VOS) 15a to 15f arranged to process polymer residues, a resist film, and a sacrificial film remaining after an etching process, by a gas containing water vapor and ozone ($O_3$), so as to denature them to be soluble in a predetermined chemical liquid. In the denaturing units (VOS) 15a to 15f, polymer residues, a resist film, and a sacrificial film remaining after an etching process only change their chemical properties to be soluble in a predetermined chemical liquid, while they maintain their shapes or the like.

Silylation units (SCH) 11a and 11b are disposed on the denaturing units (VOS) 15a and 15d, and are arranged to perform a silylation process on an inter-level insulating film damaged by the denaturing process, cleaning process, or the like, to recover the damage.

On the front side of the process station 2, there are cleaning units (CNU) 12a to 12d arranged to perform a chemical liquid process or water cleaning process on a wafer W processed by the denaturing units (VOS) 15a to 15f, so as to remove denatured polymer residues or the like.

In the process station 2, four hot plate units (HP) 19a to 19d are stacked at a position opposite to the wafer mount units (TRS) 13a and 13b with a main wafer transfer unit 14 interposed therebetween, and are arranged to heat and dry a wafer W processed by the cleaning units (CNU) 12a to 12d. Further, cooling plate units (COL) 21a and 21b are stacked on the wafer mount unit (TRS) 13a, and are arranged to cool a wafer W processed by the heat and dry process. The wafer mount unit (TRS) 13b may be arranged as a cooling plate unit. A fan and filter unit (FFU) 25 is disposed at the top of the process station 2, and is arranged to send clean air into the process station 2.

The main wafer transfer unit 14 is disposed essentially at the center of the process station 2, and is arranged to transfer a wafer W within the process station 2. The main wafer transfer unit 14 has a wafer transfer arm 14a for transferring a wafer W. The main wafer transfer unit 14 is rotatable about a Z-axis. Further, the wafer transfer arm 14a is movable back and forth in a horizontal direction, and movable up and down in the Z-direction. With this arrangement, the main wafer transfer unit 14 can access the respective units disposed in the process station 2 to transfer a wafer W between the units, without moving itself in the X-direction.

The chemical station 5 includes a process gas supply portion 16, a cleaning liquid supply portion 17, and a silylation agent supply portion 18. The process gas supply portion 16 is arranged to supply ozone, water vapor, and so forth as process gases to the denaturing units (VOS) 15a to 15f disposed in the process station 2. The cleaning liquid supply portion 17 is arranged to supply a cleaning liquid to the cleaning units (CNU) 12a to 12d. The silylation agent supply portion 18 is arranged to supply a silylation agent, a carrier gas, and so forth to the silylation units (SCH) 11a and 11b.

Figure 6:
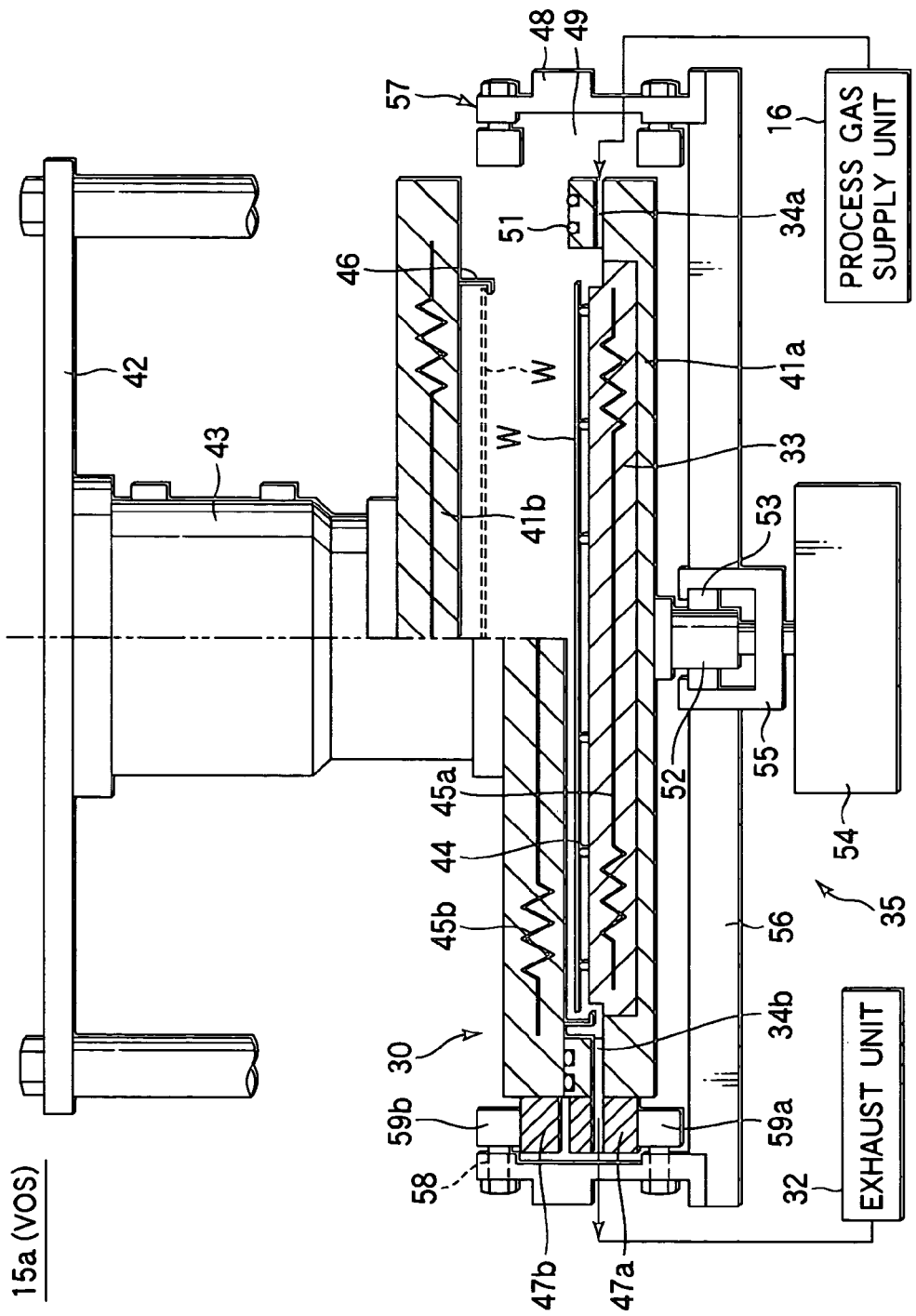
FIG. 6 is a sectional view schematically showing a denaturing unit disposed in the cleaning apparatus.

Next, a detailed explanation will be given of the structure of the denaturing unit (VOS) 15a with reference to the schematic sectional view shown in FIG. 6. The other denaturing units have exactly the same structure. This denaturing unit (VOS) 15a includes an airtight chamber 30 for accommodating a wafer W. The chamber 30 is formed of a stationary lower container 41a, and a lid 41b that covers the top face of the lower container 41a. The lid 41b is movable up and down by a cylinder 43 fixed to a frame 42 of the film denaturing unit (VOS) 15a. FIG. 6 shows both of a state where the lid 41b is in close contact with the lower container 41a, and a state where the lid 41b is retreated above the lower container 41a.

The lower container 41a is provided with an O-ring 51 disposed on the top face of a raised portion at the rim. When the lid 41b is moved down by the cylinder 43, the rim of the bottom face of the lid 41b comes into contact with the top face of the raised portion at the rim of the lower container 41a and presses the O-ring 51 to form an airtight process space in the chamber 30.

The lower container 41a includes a stage 33 for placing a wafer W thereon. The stage 33 is provided with proximity pins 44 at a plurality of positions to support the wafer W.

The stage 33 includes a heater 45a built therein, and the lid 41b includes a heater 45b built therein, so that each of the stage 33 and lid 41b is maintained at a predetermined temperature. Consequently, the temperature of a wafer W can be kept constant.

The lid 41b has hook members 46 at, e.g., three positions (only two of them are shown in FIG. 6) on the bottom face to hold a wafer W. The wafer W is transferred to and from the hook members 46 by the wafer transfer arm 14a. When the lid 41b is moved down while a wafer W is supported by the hook members 46, the wafer W is transferred onto the proximity pins 44 provided on the stage 33, on the way.

The lower container 41a has a gas feed port 34a for supplying a process gas into the chamber 30, and a gas exhaust port 34b for exhausting the process gas out of the chamber 30. The gas feed port 34a is connected to the process gas supply unit 16, and the gas exhaust port 34b is connected to an exhaust unit 32.

When a wafer W is processed by a process gas, the pressure inside the chamber 30 is preferably maintained at a constant positive pressure. For this purpose, the lower container 41a and lid 41b is supplied with not only a pressing force by the cylinder 43, but also a clamping force by a lock mechanism 35 through projecting portions 47a and 47b respectively disposed on end sides of the lower container 41a and lid 41b.

The lock mechanism 35 includes a support shaft 52, a rotary tube 55 rotatable by a rotator unit 54, a circular plate 56 fixed to the rotary tube 55, and pinching devices 57 disposed at the rim of the circular plate 56. Each of the pinching devices 57 includes press rollers 59a and 59b and a roller holding member 48 which holds rotary shafts 58.

The projecting portions 47a and 47b are equidistantly disposed at four positions, between which gap portions 49 are defined. The projecting portions 47a and 47b of each set are disposed at positions overlapping with each other. When the pinching devices 57 are positioned in the gap portions 49, the lid 41b can be freely moved up and down.

When the circular plate 56 is rotated along with the rotary tube 55 by a predetermined angle, the press rollers 59b are stopped at the top faces of the projecting portions 47b, while the press rollers 59a are stopped under the projecting portions 47a.

Next, a detailed explanation will be given of the structure of the silylation unit (SCH) 11a with reference to the schematic sectional view shown in FIG. 7. The silylation unit (SCH) 11a includes a chamber 61 for accommodating a wafer W. The chamber 61 is formed of a stationary lower container 61a, and a lid 61b that covers the lower container 61a. The lid 61b is movable up and down by an elevating unit (not shown). The lower container 61a includes a hot plate 62, around which nitrogen gas with vapor of a silylation agent carried therein, such as DMSDMA (Dimethylsilyldimethylamine), is supplied into the chamber 61. DMSDMA is vaporized by a vaporizer 63, and carried by $N_2$ gas into the chamber 61.

The hot plate 62 is adjustable in temperature within a range of, e.g., from a room temperature to 200° C. The hot plate 62 is provided with pins 64 on the surface to support a wafer W. Where a wafer W is mounted not directly on the hot plate 62, the wafer W is prevented from being contaminated on its bottom surface. The lower container 61a is provided with a first seal ring 65 disposed on the top face of the peripheral portion. The lid 61b is provided with a second seal ring 66 disposed on the bottom face of the peripheral portion. When the lid 61b is pressed against the lower container 61a, the second seal ring 66 comes into contact with the first seal ring 65. The space defined between the first and second seal rings 65 and 66 can be pressure-reduced. When the pressure of this space is reduced, it is ensured that the chamber 61 is airtight. The lid 61b has an exhaust port essentially at the center for exhausting nitrogen gas with DMSDMA carried therein supplied into the chamber 61. The exhaust port 67 is connected to a vacuum pump 69 through a pressure adjusting unit 68.

Figure 7:
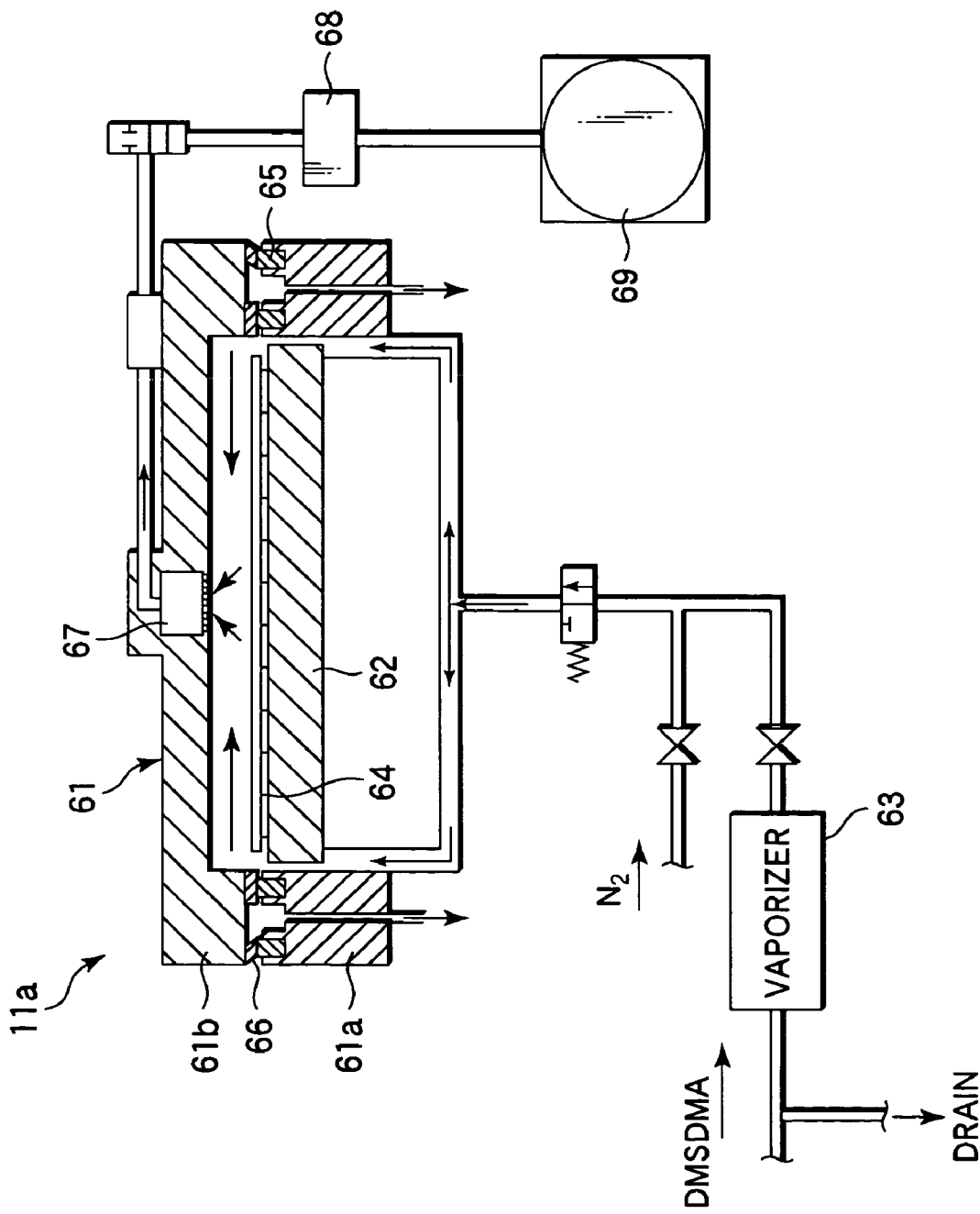
FIG. 7 is a sectional view schematically showing a silylation unit disposed in the cleaning apparatus.

In FIG. 7, liquid DMSDMA is vaporized by the vaporizer 63, and carried by $N_2$ gas into the chamber 61. Alternatively, vaporized DMSDMA gas (i.e., DMSDMA vapor) may solely be supplied into the chamber 61. When DMSDMA is supplied into the chamber 61, the interior of the chamber 61 is maintained at a predetermined vacuum level. Accordingly, utilizing the pressure difference between the vaporizer 63 and chamber 61, DMSDMA gas is easily supplied into the chamber 61. The silylation unit (SCH) 11b has exactly the same structure as the silylation unit (SCH) 11a.

Figure 8:
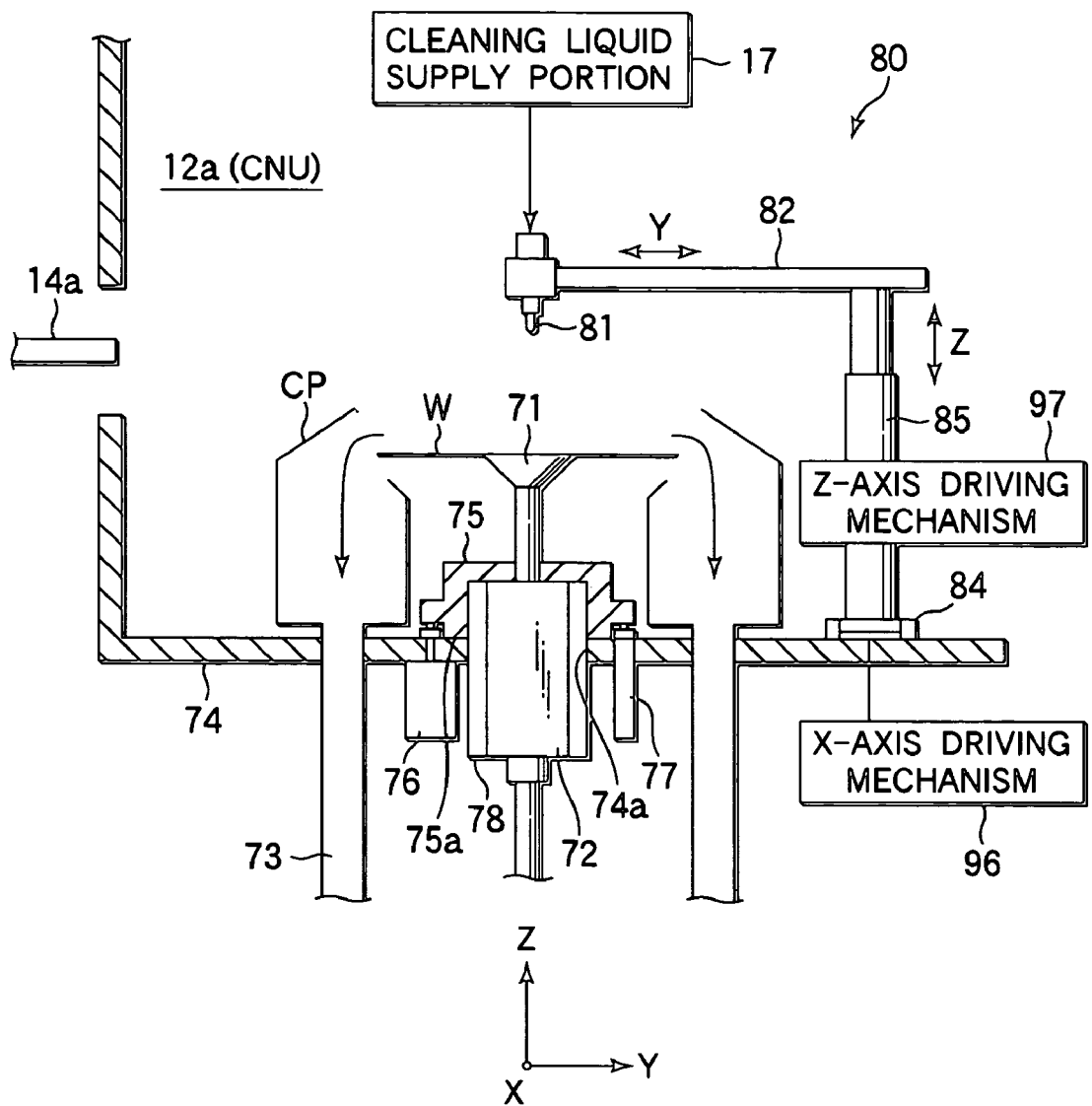
FIG. 8 is a sectional view schematically showing a cleaning unit disposed in the cleaning apparatus.

Next, a detailed explanation will be given of the structure of the cleaning unit 12a with reference to the schematic sectional view shown in FIG. 8. The cleaning unit (CNU) 12a includes an annular cup CP disposed at the center, and a spin chuck 71 disposed inside the cup (CP). The spin chuck 71 is arranged to fix and hold a wafer W by means of vacuum suction, and to be rotated by a drive motor 72 in this state. A drain pipe 73 is disposed at the bottom of the cup (CP) to exhaust the cleaning liquid and purified water.

The drive motor 72 is disposed to be movable up and down in an opening 74a formed in the unit bottom plate 74. The drive motor 72 is coupled with an elevating mechanism 76, such as an air cylinder, and a vertical guide 77 through a cap-like flange member 75. The drive motor 72 is provided with a cylindrical cooling jacket 78 attached on its side. The flange member 75 is attached to cover the upper half of the cooling jacket 78.

When a chemical liquid or the like is supplied onto a wafer W, the lower end 75a of the flange member 75 comes into close contact with the unit bottom plate 74 near the rim of the opening 74a to make the unit interior airtight. When a wafer W is transferred between the spin chuck 71 and wafer transfer arm 14a, the drive motor 72 and spin chuck 71 are moved up by the elevating mechanism 76, so that the lower end of the flange member 75 is separated upward from the unit bottom plate 74.

A cleaning liquid supply mechanism 80 is disposed above the cup (CP) to supply a predetermined cleaning liquid onto the surface of a wafer W. The cleaning liquid is used for dissolving a substance denatured by one of the denaturing units (VOS) 15a to 15f (which will be referred to as a denatured substance, hereinafter), such as a denatured sacrificial film, present on the wafer.

The cleaning liquid supply mechanism 80 includes a cleaning liquid delivery nozzle 81, a cleaning liquid supply portion 17, a scan arm 82, a vertical support member 85, and an X-axis driving mechanism 96. The cleaning liquid delivery nozzle 81 is arranged to deliver the cleaning liquid onto the surface of a wafer W held on the spin chuck 71. The cleaning liquid supply portion 17 is arranged to supply the predetermined cleaning liquid to the cleaning liquid delivery nozzle 81. The scan arm 82 is arranged to hold the cleaning liquid delivery nozzle 81, and to be movable back and forth in the Y-direction. The vertical support member 85 is arranged to support the scan arm 82. The X-axis driving mechanism 96 is disposed on a guide rail 84 extending in the X-axis direction on the unit bottom plate 74, and is arranged to shift the vertical support member 85a in the X-axis direction. The scan arm 82 is movable in the vertical direction (Z-direction) by a Z-axis driving mechanism 97, so that the cleaning liquid delivery nozzle 81 can be moved to an arbitrary position above a wafer W, and retreated to a predetermined position outside the cup (CP).

The cleaning liquid supply portion 17 can selectively supply one of a dissolving/removing liquid and a rinsing liquid consisting of purified water to the cleaning liquid delivery nozzle 81. The dissolving/removing liquid is used for dissolving a denatured substance, such as a sacrificial film, denatured by the denaturing units (VOS) 15a to 15c, and comprises, e.g., dilute hydrofluoric acid or an amine-based chemical liquid.

The denaturing units (VOS) 15a to 15c and denaturing units (VOS) 15d to 15f described above have structures essentially symmetric with respect to a partition wall 22b. The silylation unit (SCH) 11a and silylation unit (SCH) 11b have structures essentially symmetric with respect to the partition wall 22b. Similarly, the cleaning units (CNU) 12a and 12b and cleaning units (CNU) 12c and 12d have structures essentially symmetric with respect to the partition wall 22a.

Next, an explanation will be given of a semiconductor device manufacturing process employing a dual damascene method, to which a substrate processing method according to an embodiment of the present invention is applied.

Figure 9:
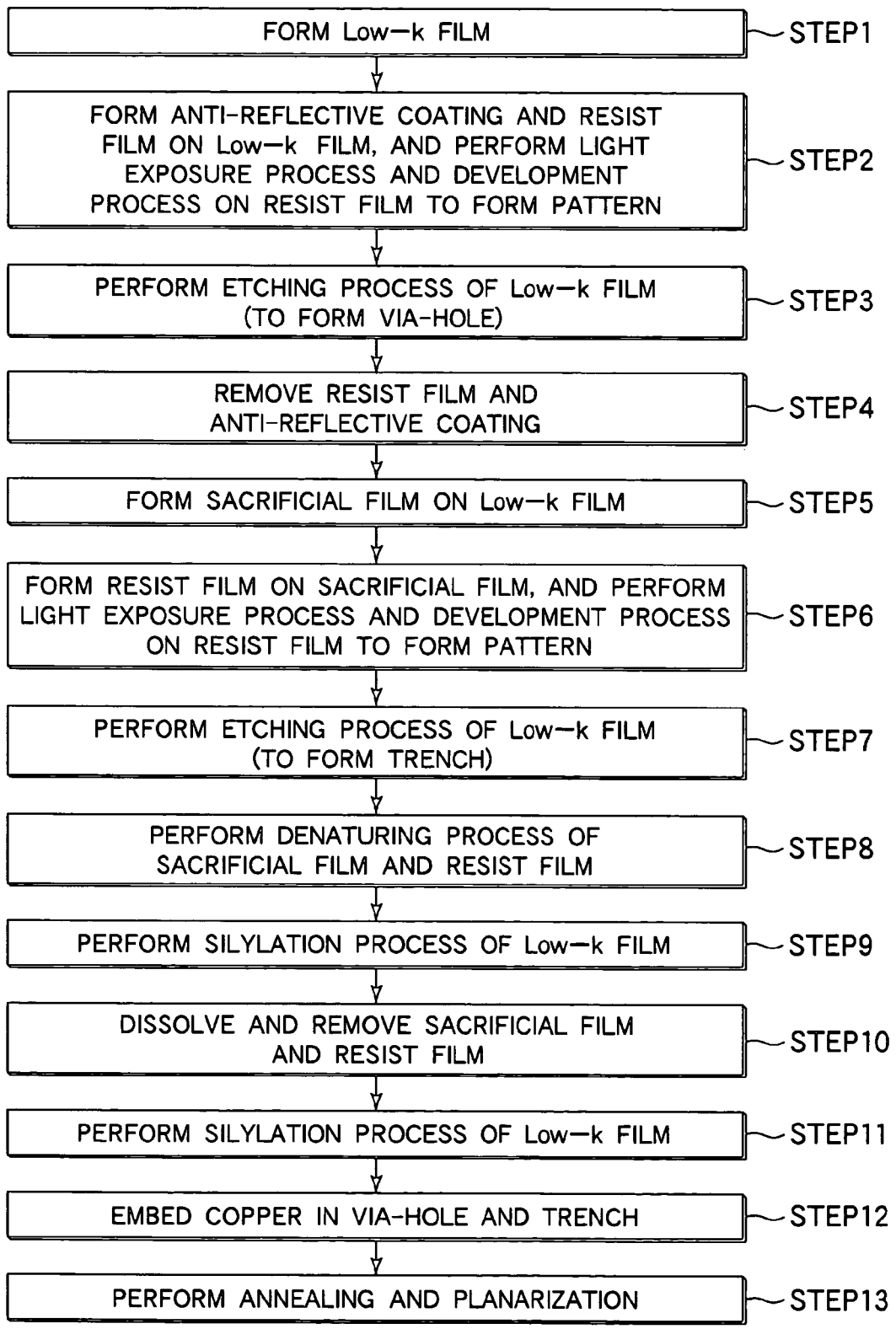
FIG. 9 is a flowchart showing a semiconductor device manufacturing process employing a dual damascene method, to which a substrate processing method according to an embodiment of the present invention is applied.

FIG. 9 is a flowchart showing a semiconductor device manufacturing process employing a dual damascene method. FIGS. 10A to 10J are sectional views showing steps of the flow shown in FIG. 9.

Figure 10A:
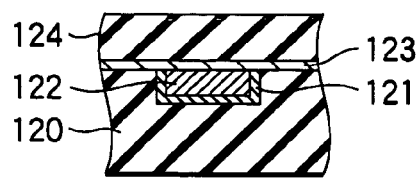
FIGS. 10A to 10J are sectional views showing steps of the flow shown in FIG. 9.
Figure 10F:
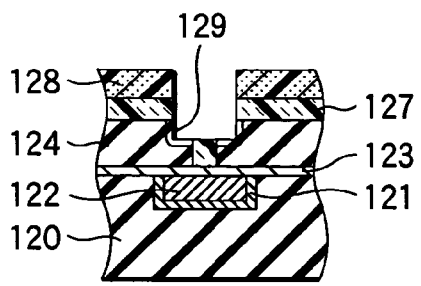

At first, a wafer W is prepared from an Si substrate (not shown) as follows. Specifically, an insulating film 120 is disposed on the substrate. A lower interconnection line 122 made of copper is disposed in the insulating film 120 with a barrier metal layer 121 interposed therebetween. A stopper film (such as an SiN film or SiC film) 123 is disposed on the insulating film 120 and lower interconnection line 122 made of copper. The wafer W is transferred into the SOD apparatus 101, in which an inter-level insulating film (which will be referred to as a Low-k film, hereinafter) 124 made of a low dielectric constant material (Low-k material) is formed on the stopper film 123 (Step 1). Consequently, the state shown in FIG. 10A is prepared.

Figure 10B:
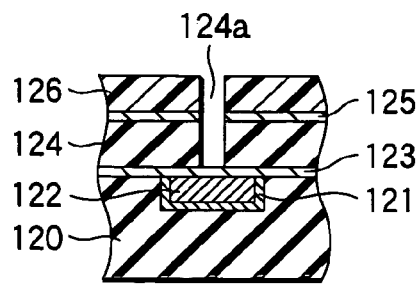
Figure 10G:
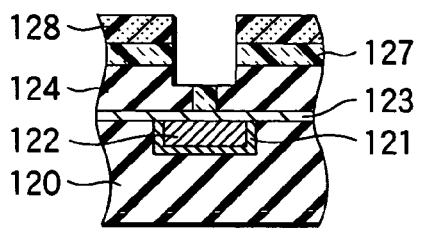

Then, the wafer W with the insulating film 124 formed thereon is transferred into the resist coating/development apparatus 102, in which an anti-reflective coating 125 and a resist film 126 are sequentially formed on the Low-k film 124 by the resist coating unit. Then, the wafer W is transferred into the light exposure apparatus 103, in which the wafer W is subjected to a light exposure process with a predetermined pattern. Then, the wafer W is transferred back into the resist coating/development apparatus 102, in which the resist film 126 is subjected to a development process by the developing unit to form a predetermined circuit pattern on the resist film 126 (Step 2). Then, the wafer W is transferred into the etching apparatus 105, in which an etching process is performed on the wafer W (Step 3). Consequently, as shown in FIG. 10B, a via-hole 124a reaching the stopper film 123 is formed in the Low-k film 124.

Figure 10C:
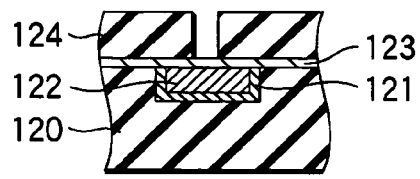

The wafer W with the via-hole 124a formed thereon is transferred into the cleaning apparatus 104, in which a chemical liquid process is performed on the wafer W by one of the cleaning units (CNU) 12a to 12d to remove the resist film 126 and anti-reflective coating 125 from the wafer W (Step 4 and FIG. 10C).

Then, the wafer W is transferred into the resist coating/development apparatus 102, in which a sacrificial film 127 made of an inorganic material (such as an Si—O based material) is formed on the surface of the Low-k film 124 having the via-hole 124a by the sacrificial film coating unit (Step 5). At this time, the via-hole 124a is filled with the sacrificial film 127. Then, a resist film 128 to be used as an etching mask is formed on the surface of the sacrificial film 127 by the resist coating unit. Then, the resist film 128 is subjected to light exposure with a predetermined pattern by the light exposure apparatus 103. Then, the resist film 128 is subjected to a development process by the developing unit (Step 6). Consequently, as shown in FIG. 10D, a circuit pattern is formed on the resist film 128, such that a groove wider than the via-hole 124a is formed in the resist film 128 above the via-hole 124a.

Then, the wafer W is transferred into the etching apparatus 105, in which an etching process is performed on the surface of the wafer W (Step 7). Consequently, as shown in FIG. 10E, a wider trench 124b is formed above the via-hole 124a. Since the sacrificial film 127 is formed on the Low-k film 124, the bottom surface of the etched portion in the Low-k film 124 can be flat.

Figure 10H:
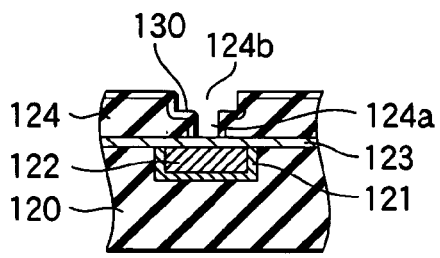
Figure 10D:
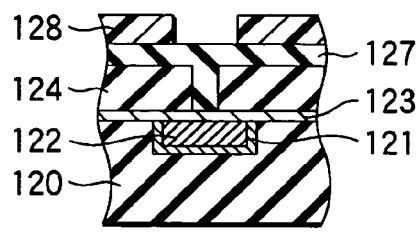
Figure 10I:
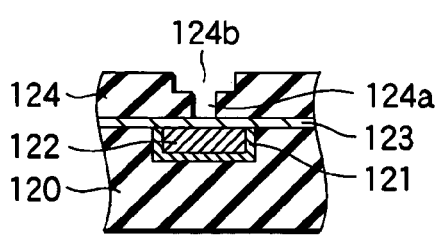
Figure 10E:
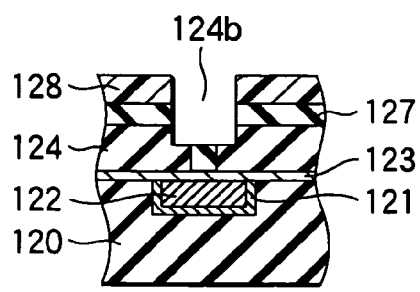
Figure 10J:
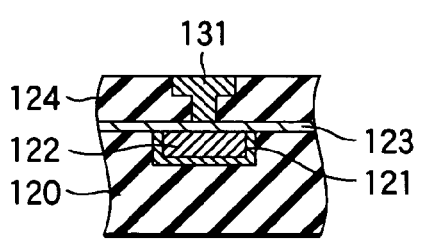

The wafer W thus treated by the etching process is transferred into the cleaning apparatus 104, in which the wafer W is sequentially subjected to a denaturing process of the sacrificial film 127 and resist film 128 (Step 8 and FIG. 10F), a silylation process of the Low-k film 124 (Step 9 and FIG. 10G) after the denaturing process, and a removing process of the sacrificial film 127, resist film 128, and polymer residues (Step 10 and FIG. 10H).

Specifically, at first, a carrier C storing wafers treated by the etching process is placed on the table 6. Then, the lid 10a of the carrier C and the shutter 10 are retreated in the transfer station 3 side to open the corresponding window portion 9a. Then, a wafer W at a predetermined position in the carrier C is transferred into the wafer mount unit (TRS) 13b by the wafer transfer pick 7a.

Then, the wafer W placed in the wafer mount unit (TRS) 13b is transferred by the wafer transfer arm 14a into one of the denaturing units (VOS) 15a to 15h, in which the denaturing process of the sacrificial film 127 and resist film 128 is performed in Step 8 described above (FIG. 10F).

In this case, the lid 41b of the chamber 30 is first retreated above the lower container 41a. In this state, the wafer transfer arm 14a that holds the wafer W is moved forward such that the wafer W is inserted at a position slightly higher than the portions for supporting the wafer W in the hook members 46 attached to the lid 41b (portions extending in the horizontal direction). Then, the wafer transfer arm 14a is moved down to transfer the wafer W onto the hook members 46.

After the wafer transfer arm 14a is retreated from the denaturing unit (VOS) 15a, the lid 41b is moved down to bring the lid 41b into close contact with the lower container 41a, and the lock mechanism 35 is further operated to set the chamber 30 in an airtight state. When the lid 41b is moved down, the wafer W is transferred from the hook members 46 onto the proximity pins 44 on the way.

The stage 33 is maintained at a predetermined temperature by the heaters 45a and 45b. For example, the stage 33 is maintained at 100° C., and the lid 41b is maintained at 110° C.

When the stage 33 and lid 41b are set at predetermined temperatures (such as 110° C. to 120° C.), and the temperature distribution of the wafer W becomes essentially uniform, a mixture gas of ozone and nitrogen (with an ozone content of 9 wt % and at a flow rate of 4 L/min, for example) is first solely supplied from the process gas supply unit 16 into the chamber 30. At this time, the gas is adjusted such that the chamber 30 is filled with the mixture gas of ozone and nitrogen to have a predetermined positive pressure of, e.g., 0.2 MPa by gauge pressure.

Then, a process gas prepared by mixing water vapor with the mixture gas of ozone and nitrogen (with a water vapor content corresponding to 16 ml/min expressed in terms of liquid, for example) is supplied from the process gas supply unit 16 into the chamber 30. With this process gas, the sacrificial film 127 formed on the wafer W is denatured to be easily dissolved in a particular chemical liquid, such as HF. Further, polymer residues deposited on the resist film 128 and wafer W (such as polymer residues generated by the etching process) are also denatured to be easily dissolved in the chemical liquid. As described above, the process gas denatures the sacrificial film 127, resist film, and polymer residues. The supply rate and exhaust rate of the process gas to and from the chamber 30 are controlled for the interior of the chamber 30 to have a predetermined positive pressure.

When the process using the process gas on the wafer W is finished, the supply of the process gas is stopped. Further, nitrogen gas is supplied from the process gas supply unit 16 into the chamber 30 to purge the interior of the chamber 30 with nitrogen gas. This purge process is performed to completely exhaust the mixture gas of ozone and nitrogen even from the exhaust unit 32, so that no mixture gas of ozone and nitrogen flows from the exhaust unit 32 back into the chamber 30 and leaks out of the chamber 30 when the chamber 30 is opened thereafter.

When the nitrogen gas purge process is finished, it is confirmed that the inner pressure and external pressure of the chamber 30 are the same. This is done, because, if the chamber 30 is opened while the inner pressure of the chamber 30 is higher than atmospheric pressure, the chamber 30 may be damaged. After the inner pressure of the chamber 30 is confirmed, the lock mechanism 35 breaks up the clamping force applied to the lower container 41a and lid 41b, and then the lid 41b is moved up. When the lid 41b is moved up, the wafer W is moved up along with the lid 41b while being supported by the hook members 46. Then, the wafer transfer arm 14a is inserted into the gap between the lower container 41a and lid 41b, so that the wafer W is transferred from the hook members 46 onto the wafer transfer arm 14a.

When the denaturing process is finished at one of the film denaturing units (VOS) 15a to 15f, the sacrificial film 127 and so forth have been not yet removed from the wafer W. Accordingly, a dissolving/removing process (cleaning process) is performed to remove the sacrificial film 127 and so forth from the wafer W (Step 10 described above). However, the patterned Low-k film 124 may have been damaged by the process using water vapor and ozone in the denaturing unit (VOS). If the dissolving/removing process using a chemical liquid is subsequently performed on the film with such damage, pattern peeling may be caused.

In light of this, according to this embodiment, the silylation process of Step 9 described above is performed in one of the silylation units 11a and 11b before the dissolving/removing process. This process allows the Low-k film 124 to recover damage, and thereby prevents pattern peeling from being caused in the dissolving/removing process.

Figure 11:
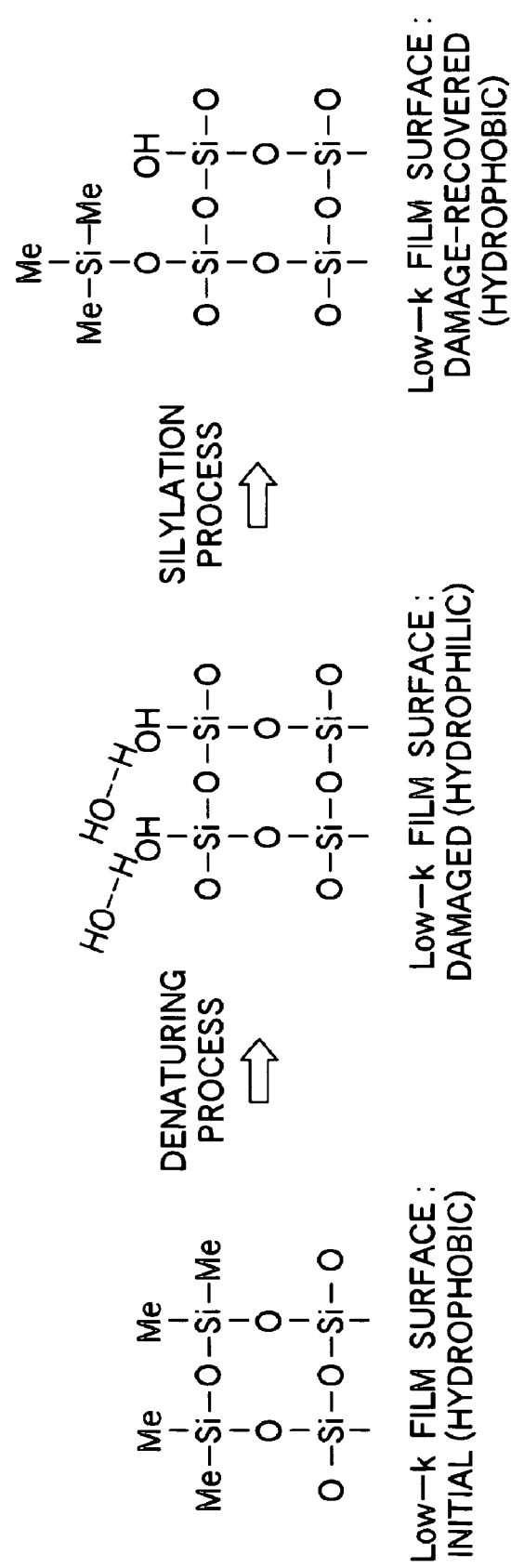
FIG. 11 is a view for explaining a damage of a Low-k film and recovery thereof by silylation.

Damaged portions of this kind have a state with damage as shown in FIG. 11. Specifically, the Low-k film 124, which has methyl groups (Me) as end groups and thus is hydrophobic, reacts with water molecules during the denaturing process using water vapor and ozone. Consequently, the number of methyl groups is decreased and the number of hydroxyl groups is increased near the sidewall of the via-hole 124a. If the removing process of the sacrificial film 127 and so forth is performed in this state, film peeling may be caused due to the damage. In this respect, according to this embodiment, the silylation process is performed to make the Low-k film surface hydrophobic, and thereby recover the damage. Further, hydrophilic damaged portions formed at this time increase the dielectric constant of the Low-k film, but the silylation process can decrease the dielectric constant. Although FIG. 10F clearly shows a damaged portion 129 formed in the Low-k film 124 for the sake of convenience, the boundary between the damaged portion 129 and non-damaged portion is not necessarily clear.

In the silylation process of Step 9, the wafer W is transferred into one of the silylation units (SCH) 11a and 11b, and is placed on the support pins 64 of the hot plate 62. Then, a silylation agent, such as DMSDMA vapor, carried by $N_2$ gas is supplied into the chamber 61. The conditions of the silylation process are suitably selected in accordance with the type of the silylation agent, as follows. For example, the temperature of the vaporizer 63 is set to be from a room temperature to 50° C. The silylation agent flow rate is set to be 0.6 to 1.0 g/min. The N₂ gas (purge gas) flow rate is set to be 1 to 10 L/min. The process pressure is set to be 532 to 95,976 Pa (4 to 720 Torr). The temperature of the hot plate 62 is set to be from room temperature to 200° C. Where DMSDMA is used as the silylation agent, the following method may be used, for example. Specifically, the temperature of the hot plate 62 is set at 100° C., and the inner pressure of the chamber 61 is decreased to 5 Torr (=666 Pa). Then, DMSDMA vapor carried by N₂ gas is supplied into the chamber 61 until the inner pressure reaches 55 Torr. Then, the process is performed for, e.g., three minutes, while maintaining the pressure. The silylation reaction using DMSDMA is expressed by the following reaction formula.

Insert the Reaction Formula.

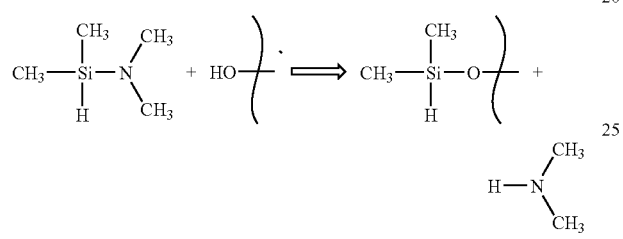

The silylation agent is not limited to DMSDMA described above, and the agent may comprise any substance as long as it causes a silylation reaction. However, it is preferable to use a substance having a relatively small molecular structure selected from the compounds including silazane bonds (Si—N bonds) in molecules, such as a substance having a molecular weight preferably of 260 or less, and more preferably of 170 or less. Namely, examples other than DMSDMA and HMDS are TMSDMA (Dimethylaminotrimethylsilane), TMDS (1,1,3,3-Tetramethyldisilazane), TMSPyrole (1-Trimethylsilylpyrole), BSTFA (N,O-Bis(trimethylsilyl)trifluoroacetamide), and BDMADMS (Bis(dimethylamino)dimethylsilane). The chemical structures of these substances are as follows.

Insert the Chemical Structures.

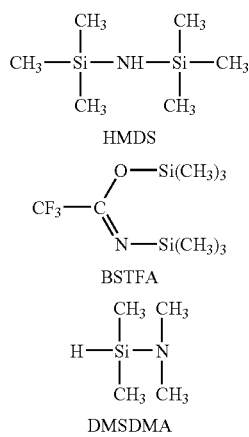

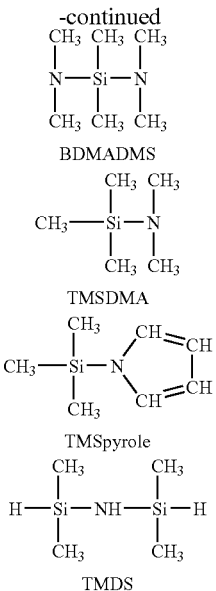

Of the compound set out above, TMSDMA and TMDS are preferably used, because they are high in the effect of recovering the dielectric constant, and the effect of decreasing the leakage current. Further, in light of the stability after silylation, it is preferable to use a substance (such as TMSDMA or HMDS) having a structure in which Si of each silazane bond is bonded to three alkyl groups (such as methyl groups).

The wafer W thus treated by the silylation process is transferred into one of the cleaning units (CNU) 12a to 12d, in which a dissolving/removing process of the sacrificial film 127 and so forth is performed by a predetermined chemical liquid that can dissolve the sacrificial film 127 and so forth (such as dilute hydrofluoric acid or amine-based chemical solution), (Step 10 described above and FIG. 10H). By the denaturing process, the sacrificial film 127 becomes soluble in various chemical liquids. Particularly, an acid chemical liquid (solution), such as hydrofluoric acid, can strongly damage patterns. Accordingly, the silylation process of Step 9 described above is more effective, where an acid chemical liquid is used.

When the dissolving/removing process is performed, the wafer W is transferred into one of the cleaning units (CNU) 12a to 12d. The wafer W is placed on the spin chuck 71 and is held thereon essentially in a horizontal state by means of vacuum suction. Then, a chemical liquid that can dissolve denatured substances of the sacrificial film 127 and so forth is supplied from the cleaning liquid delivery nozzle 81 of the cleaning liquid supply mechanism 80 onto the surface of the wafer W to form a puddle of the liquid. After this state is held for a predetermined time, the wafer W is rotated to throw off the chemical liquid from surface of the wafer W. Further, while the wafer W is rotated, the chemical liquid is supplied onto the surface of the wafer W to completely remove the sacrificial film 127 and so forth. At this time, the resist film 128 and polymer residues are also dissolved and removed by the chemical liquid for removing the sacrificial film 127. After the chemical liquid process, while the wafer W is rotated by the drive motor 72, purified water is supplied onto the wafer W to perform a water cleaning process on the wafer W. Then, the wafer W is rotated at a higher speed to perform spin-drying. The spin-drying of the wafer W may be performed while a drying gas is supplied onto the wafer W.

A damaged portion 130 may be formed by this process in the surface of the Low-k film 124, as shown in FIG. 10H. This damaged portion 130 is a portion changed from a hydrophobic state to a hydrophilic state when the Low-k film 124 is subjected to the dissolving/removing process of Step 10. This portion increases the specific dielectric constant of the Low-k film 124, and thus increases the parasitic capacitance between interconnection lines after interconnection line formation. Consequently, problems arise in electric properties such that a signal delay occurs and the insulation between groove interconnection lines is deteriorated. Also in this case, although FIG. 10H clearly shows the damaged portion 130 formed in the Low-k film 124 for the sake of convenience, the boundary between the damaged portion 130 and non-damaged portion is not necessarily clear.

In this case, after the dissolving/removing process of Step 10, a silylation process is performed again, following the same procedures used in Step 9 described above (Step 11 and FIG. 10I). Consequently, the damage formed in the Low-k film 124 by the dissolving/removing process of denatured substances is recovered on the same principle. Further, the specific dielectric constant of the Low-k film 124 is also recovered, so as to prevent the problems described above in electric properties.

Then, the wafer W is transferred into the sputtering apparatus 106, in which a barrier metal film and a Cu seed layer (i.e., plating seed layer) are formed on the inner surface of the via-hole 124a. Then, the wafer W is transferred into the electrolytic plating apparatus 107, in which copper 131 used as an interconnection line metal is embedded in the via-hole 124a and trench 124b by electrolytic plating (Step 12 and FIG. 10J). Thereafter, the wafer W is subjected to a heat process to perform an annealing process of the copper 131 embedded in the via-hole 124a and trench 124b (no annealing apparatus is shown in FIG. 1). Then, the wafer W is transferred into the CMP apparatus 109, in which a planarization process of the wafer W is performed by a CMP method (Step 13). Consequently, a predetermined semiconductor device is manufactured.

As described above, in order to remove the sacrificial film 127 and so forth, the sacrificial film 127 and so forth are denatured to be soluble in a predetermined chemical liquid, and then the denatured substances are dissolved and removed by the chemical liquid. In this method being employed, damage formed in the Low-k film 124 by the denaturing process is recovered by the silylation process, and then the subsequent dissolving/removing process is performed. Consequently, problems, such as pattern peeling, are prevented from being caused by the dissolving/removing process. Further, damage is formed in the Low-k film 124 by the dissolving/removing process, and may increase the specific dielectric constant of the film. However, the silylation process is subsequently performed again to recover the damage, and the specific dielectric constant of the film is thereby drastically decreased.

Next, an explanation will be given of experiments conducted to confirm effects of the present invention. In the experiments, the Low-k film 124 made of SiCHO was used and processed to obtain the state shown in FIG. 10E, following the procedures described above. Then, the denaturing process using a mixture gas of water vapor and ozone was performed under conditions including a temperature of 100 to 200° C. and a pressure of from atmospheric pressure to 200 kPa to denature the sacrificial film 127 to be soluble in HF. Thereafter, the silylation process was performed under conditions including a temperature of 50 to 250° C. and a pressure of 1.33 to 26.6 kPa. Then, the dissolving/removing process of the sacrificial film 127 and so forth was performed, using HF. Thereafter, an examination was performed in terms of the pattern state, and found no pattern peeling. On the other hand, the denaturing process was performed under the same conditions used in the former example, and then the dissolving/removing process was performed in the same manner described above, but with no silylation process interposed therebetween. As a result, abnormal patterns, such as pattern peeling, were found in this latter example. From the results described above, it has been confirmed that the silylation process inserted between the denaturing process and dissolving/removing process remarkably suppresses pattern damage, such as pattern peeling.

Next, under the same conditions as those described above, the denaturing process, the silylation process, and the dissolving/removing process were sequentially performed, and then the silylation process was further performed under the same conditions. After this process, the specific dielectric constant (k-value) of the Low-k film was measured, and was confirmed to have been recovered to a state near the initial state. On the other hand, the denaturing process was performed under the same conditions used in the former example, and then the dissolving/removing process was performed in the same manner described above, but with no silylation process interposed therebetween, nor silylation process at the end. As a result, the k-value of the Low-k film was high, because no recovery was obtained. Furthermore, under the same conditions as those described above, the denaturing process, the silylation process, and the dissolving/removing process were sequentially performed, but no silylation process was performed at the end. In this example, the k-value of the Low-k film was lower than that of the example using none of the silylation processes, but higher than that of the example using the silylation process at the end.

The present invention is not limited to the embodiment described above, and it may be modified in various manners. For example, in the embodiment described above, the denaturing process of the sacrificial film and so forth is performed using a mixture gas of water vapor and ozone, but the process may be performed solely using ozone gas without water vapor. Where the process is performed solely using ozone gas, the reactivity becomes lower as compared with a case using water vapor and ozone, but the sacrificial film and so forth thus denatured can be sufficiently dissolved in the subsequent dissolving/removing process using a chemical liquid.

Further, the Low-k film on which damage recovery can be achieved by the silylation process is not limited to a specific film, and it may be an SOD film of porous MSQ. Alternatively, for example, an SiOC-based film, which is an inorganic insulating film formed by CVD, may be used. A film of this type can be prepared from a conventional $SiO_2$ film by introducing methyl groups ($-CH_3$) into Si—O bonds present on the film to mix Si—$CH_3$ bonds therewith. Black Diamond (Applied Materials Ltd.), Coral (Novellus Ltd.), and Aurora (ASM Ltd.) correspond to this type. Furthermore, it is possible to employ a porous SiOC-based film. Also, it is possible to employ an MSQ-based insulating film having a compact texture in place of a porous texture.

In the embodiment described above, the present invention is applied to a process using a dual damascene method for manufacturing a semiconductor device including a copper interconnection line, but this is not limiting. The present invention may be applied to any process in which an etching target film may be deteriorated, and a substance to be denatured and removed is present.

What is claimed is:

1. A substrate processing method comprising:
performing an etching process to form a predetermined pattern on an etching-target film disposed on a substrate;
denaturing a substance remaining after the etching process to be soluble in a predetermined liquid;
then, performing a silylation process on a surface of the etching-target film having the pattern formed thereon; and
then, supplying the predetermined liquid to dissolve and remove the denatured substance.

2. The substrate processing method according to claim 1, wherein the method further comprises performing a silylation process on a surface of the etching-target film after removing the denatured substance.

3. The substrate processing method according to claim 1, wherein the etching-target film comprises a low dielectric constant material.

4. The substrate processing method according to claim 3, wherein the low dielectric constant material includes alkyl groups as end groups.

5. The substrate processing method according to claim 1, wherein said denaturing is performed while supplying a process gas containing water vapor and ozone.

6. The substrate processing method according to claim 1, wherein said denaturing is performed while supplying a process gas containing ozone.

7. The substrate processing method according to claim 1, wherein the predetermined liquid is an acid or alkaline chemical liquid.

8. The substrate processing method according to claim 1, wherein the silylation process is performed while using a compound including silazane bonds (Si—N) in molecules.

9. The substrate processing method according to claim 8, wherein the compound including silazane bonds in molecules is TMDS (1,1,3,3-Tetramethyldisilazane) or TMSDMA (Dimethylaminotrimethylsilane).

10. A substrate processing method comprising:
forming a sacrificial film on an etching-target film disposed on a substrate;
forming an etching mask on the sacrificial film, and etching the sacrificial film and the etching-target film to form a predetermined pattern;
denaturing the sacrificial film and the etching mask to be soluble in a predetermined liquid;
then, performing a silylation process on a surface of the etching-target film having the pattern formed thereon; and
then, supplying the predetermined liquid to dissolve and remove the denatured substance.

11. The substrate processing method according to claim 10, wherein the method further comprises performing a silylation process on a surface of the etching-target film after removing the denatured substance.

12. The substrate processing method according to claim 10, wherein the etching-target film comprises a low dielectric constant material.

13. The substrate processing method according to claim 12, wherein the low dielectric constant material includes alkyl groups as end groups.

14. The substrate processing method according to claim 10, wherein said denaturing is performed while supplying a process gas containing water vapor and ozone.

15. The substrate processing method according to claim 10, wherein said denaturing is performed while supplying a process gas containing ozone.

16. The substrate processing method according to claim 10, wherein the predetermined liquid is an acid or alkaline chemical liquid.

17. The substrate processing method according to claim 10, wherein the silylation process is performed while using a compound including silazane bonds (Si—N) in molecules.

18. The substrate processing method according to claim 17, wherein the compound having silazane bonds in molecules is TMDS (1,1,3,3-Tetramethyldisilazane) or TMSDMA (Dimethylaminotrimethylsilane).

19. A substrate processing method comprising:
performing a silylation process on a surface of an etching-target film, which is disposed on a substrate and has a pattern formed thereon by an etching process, wherein there is a substance remaining on the substrate after the etching process and denatured to be soluble in a predetermined liquid;
then, supplying the predetermined liquid to dissolve and remove the denatured substance.

20. A computer readable storage medium that stores a control program for execution on a computer to control a substrate processing system for processing a substrate, wherein the control program, when executed, causes the computer to control the substrate processing system to conduct a substrate processing method comprising: performing an etching process to form a predetermined pattern on an etching-target film disposed on a substrate; denaturing a substance remaining after the etching process to be soluble in a predetermined liquid; then, performing a silylation process on a surface of the etching-target film having the pattern formed thereon; and then, supplying the predetermined liquid to dissolve and remove the denatured substance.

21. A computer readable memory medium that stores a control program for execution on a computer to control a substrate processing system for processing a substrate, wherein the control program, when executed, causes the computer to control the substrate processing system to conduct a substrate processing method comprising: forming a sacrificial film on an etching-target film disposed on a substrate; forming an etching mask on the sacrificial film, and etching the sacrificial film and the etching-target film to form a predetermined pattern; denaturing the sacrificial film and the etching mask to be soluble in a predetermined liquid; then, performing a silylation process on a surface of the etching-target film having the pattern formed thereon; and then, supplying the predetermined liquid to dissolve and remove the denatured substance.

22. A computer readable memory medium that stores a control program for execution on a computer to control a substrate processing system for processing a substrate, wherein the control program, when executed, causes the computer to control the substrate processing system to conduct a substrate processing method comprising: performing a silylation process on a surface of an etching-target film, which is disposed on a substrate and has a pattern formed thereon by an etching process, wherein there is a substance remaining on the substrate after the etching process and denatured to be soluble in a predetermined liquid; and then, supplying the predetermined liquid to dissolve and remove the denatured substance.

* * * * *